(12) United States Patent
Abbott (10) Patent No.: US 8,227,298 B2
(45) Date of Patent: Jul. 24, 2012

(54) SEMICONDUCTOR PACKAGE HAVING BUSS-LESS SUBSTRATE

(75) Inventor: Donald C Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/047,991

(22) Filed: Mar. 15, 2011

(65) Prior Publication Data

US 2011/0165732 A1 Jul. 7, 2011

Related U.S. Application Data

(62) Division of application No. 12/168,280, filed on Jul. 7, 2008, now Pat. No. 7,928,574.

(60) Provisional application No. 60/957,380, filed on Aug. 22, 2007.

(51) Int. Cl.
  *H01L 21/50* (2006.01)
(52) U.S. Cl. .................. 438/126; 257/E21.511
(58) Field of Classification Search .......... 438/106–108, 438/126, 124–125, 127, 129; 257/E21.511, 257/E21.503
See application file for complete search history.

(56) References Cited

U.S. PATENT DOCUMENTS

| | | |
|---|---|---|
| 5,637,920 A | 6/1997 | Loo |
| 6,358,836 B1 | 3/2002 | Lu et al. |
| 7,138,711 B2 | 11/2006 | Yee et al. |
| 7,199,459 B2 | 4/2007 | Pu et al. |
| 2004/0124541 A1 | 7/2004 | Wu et al. |
| 2005/0151273 A1 | 7/2005 | Arnold et al. |
| 2007/0170571 A1* | 7/2007 | Gerber et al. ............... 257/686 |

* cited by examiner

*Primary Examiner* — Hoa B Trinh
(74) *Attorney, Agent, or Firm* — Steven A. Shaw; W. James Brady; Frederick J. Telecky, Jr.

(57) ABSTRACT

A ball grid array device with an insulating substrate (110) having metal traces (106, for example copper, about 18 μm thick) with sidewalls (108) at right angles to the trace top. The traces are grouped in a first (120) and a second set (121). The first set traces have the top surface covered by a thin noble metal (for example a nickel layer (130) about 0.1 μm thick and an outermost gold layer (131) about 0.5 μm thick), while the sidewalls are un-covered by the noble metal. About 1.5 μm are thus gained for the trace spacing; oxidation of the trace sidewalls is enabled. The second set traces have the top surface un-covered by the noble metal; the traces are covered by an insulating soldermask. A semiconductor chip (101) with terminals (102) is attached to the substrate with the terminals connected to the noble metal of the first set traces, either by bonding wires (for example gold) or by metal studs (for example gold). The assembled chip and the first set traces are encapsulated in a polymerized compound (160), which adheres to the oxidized trace sidewalls and locks into the trace undercuts at the substrate interface.

16 Claims, 6 Drawing Sheets

SEMICONDUCTOR PACKAGE HAVING BUSS-LESS SUBSTRATE

This is a division of application Ser. No. 12/168,280 filed Jul. 7, 2008 which claims the benefit of provisional application Ser. No. 60/957,380 filed Aug. 22, 2007, the contents of which are herein incorporated by reference in its entirety.

FIELD OF THE INVENTION

The present invention is related in general to the field of semiconductor devices and processes, and more specifically to the structure and fabrication process of substrates of ball grid array packages combining small size with high signal numbers.

DESCRIPTION OF RELATED ART

In the popular ball-grid-array (BGA) packages of electronic devices, the semiconductor chip is inside the package, assembled on an insulating substrate with at least one metal layer for interconnecting traces. On the outside of the substrate are the solder balls for connection to external parts.

In recent years, the flip-mounting of the chips onto the substrates has become the favorite assembly technique for BGA packages, because flip-chip assembly offers the thinnest packages and thus supports the ongoing trend of device miniaturization. The semiconductor chips, which are intended for the flip-operation, have their terminals prepared with metal bumps, such as gold studs or solder balls, to enable the connection to traces or pads on the substrate. This connection, however, requires surfaces of the substrate traces, which have metallurgical affinity to gold or solder attachment.

The metallurgical affinity is commonly achieved by plating layers of suitable metals on the base metal of the substrate traces and pads. For example, for substrates with copper as the base metal of the traces and pads, a nickel layer is plated on the copper traces followed by a gold layer as the outermost metal. As a popular plating technique, electroplating offers controls for thick as well as thin layers, while electroless plating is not generally suitable for thin nickel layers (less than 0.5 μm).

The electroplating technique requires buss or tie bars for routing electrical potential and current to all substrate features that require plating. Bus and tie bars consume precious substrate real estate, which thus cannot be available for placing signal traces. Consequently, the need for bus and tie bars limits the number of signal traces in advanced BGA devices.

In addition, buss and tie bars are cut in the final assembly, when the devices are taken out of the substrate strip. For substrates with copper metallization, this cut leaves exposed copper at the edges of the package that can corrode in MFG (Mixed Flowing Gas) corrosion resistance testing (which simulate shelf life by accelerated aging). Consequently, the need for bus and tie bars introduces a reliability hazard for the finished BGA devices.

The plating process deposits layers on all metallic surfaces (top and sides) of the biased traces. The traces thus become more voluminous and limit further reductions of the trace pitch. Consequently, the fine substrate pitches required for advanced BGA high signal devices are difficult to achieve.

In addition, while copper surfaces, which oxidize easily, are favorable for strong adhesion to epoxy-based molding compounds, nickel and noble metals degrade the adhesion. Further, the generous plating of traces with precious metals is actually wasteful and expensive.

In order to solve these limitations and difficulties, conventional technology adds more metal layers to the original single metal layer of the substrate. These layers, however, have to be patterned into traces, and the traces of the various layers have to be interconnected with metal-filled through-holes (so-called conductive vias)—an altogether expensive solution, considering the fact that each additional metal layer and the required vias add between 10% and 30% to the substrate cost.

SUMMARY OF THE INVENTION

The shortcomings of the conventional electroplating technique in the fabrication of substrates for semiconductor packages include the sacrificial substrate real estate for placing the buss bars needed for plating the traces, the compromised trace pitch due to the enlarged trace volume after depositing the plated layers, and the diminished adhesion of the plated traces to the encapsulating molding compounds.

Applicant discovered that these shortcomings can be avoided by a substrate-wide seed layer for distributing the plating potential, by defining the traces with a resist and, after electrolytically plating the traces (about 18 μm copper) on the exposed seed layer, by keeping the resist on the trace sides as shields to restrict the deposition of additional layers to the trace tops. Applicant's process is well suited for plating traces with any aspect ratio height/width, and for plating thin nickel (0.08±0.04 μm) and gold layers (about 0.5 μm thick) on the trace tops. After resist removal and seed layer etching, the package encapsulation compound finds improved adhesion on the oxidized copper trace sides. As an unexpected benefit, the anisotropic etching of the seed layer creates an etch undercut, which offers an additional lock for the polymerized encapsulation compound, thus enhancing the compound adhesion.

One embodiment of the invention is a ball grid array (BGA) device with an insulating substrate having metal traces (for example copper, about 18 μm thick) with sidewalls at right angles to the trace top. The traces are grouped in a first and a second set. The first set traces have the top surface covered by a thin noble metal (for example a nickel layer about 0.1 μm thick and an outermost gold layer about 0.5 μm thick), while the sidewalls are un-covered by the noble metal, which gains about 1.5 μm for the trace spacing and allows oxidation of the trace sidewalls. The second set traces have the top surface un-covered by the noble metal; the traces are covered by an insulating soldermask. A semiconductor chip with terminals is attached to the substrate with the terminals connected to the noble metal of the first set traces, either by bonding wires (for example gold) or by metal studs (for example gold). The assembled chip and the first set traces are encapsulated in a polymerized compound, which adheres to the oxidized trace sidewalls and locks into the trace undercuts at the substrate interface.

Another embodiment of the invention is a method for fabricating a BGA device with the chip either wire-bonded or flipped onto a substrate. An electroless plating process deposits a seed layer of about 0.2 to 0.5 μm of a first metal, preferably copper, on a polyimide-based flat tape and in its thorough-holes. A first layer of photoresist is then laminated on the seed layer. A photomask is applied to define the interconnect traces to be formed on the tape (a plurality of the traces are aligned with the through-holes). After development, the openings in the photoresist have sidewalls normal to the flat tape and expose portions of the seed layer. Using the seed layer to apply electrical potential across the tape, an electrolytic plating process deposits additional first metal (preferably copper) on the exposed seed layer portions, creating traces of a first height (about 18 μm) and a rectangular cross section. After grouping the traces an a first and a second set, a second layer of photoresist is deposited to mask the second set traces and a layer of bondable metal is electrolytically plated on top of the un-masked first set traces. In the preferred process, the bondable metal comprises a stack of a thin nickel layer (about 0.05 μm) in contact with the first metal and an outermost noble metal layer (preferably gold about 0.5 μm thick). Both photoresist layers are then stripped, whereby the first metal of the trace sidewalls is oxidized. After flash etching the left-over seed layer and protecting the traces with a soldermask, a semiconductor chip with terminals is connected to the bondable metal on the first set traces either by wire bonding or by flipping.

It is a technical advantage of the using a seed layer for distributing the electrical plating potential that buss or tie bars are no longer required and the substrate design space thus gained can be used for additional signal traces. In addition, the electroplating process is well suited for creating traces of specific aspect ratios to keep electrical resistance and trace fatigue low, while enhancing the adhesion to plastic encapsulation compounds of the oxidized copper trace sidewalls. The electroplating process is also well suited to deposit thin nickel layers.

In is another technical advantage that the plating the trace sidewalls is avoided. Not only does this avoidance save precious metal (such as gold or palladium), it also gains about 1.5 μm in trace spacing and thus supports denser layout of the traces. Consequently, the process of the invention represents a universal solution for thin nickel/gold layers.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIGS. 3 to 12 illustrate certain process steps of the substrate fabrication method according to an embodiment of the invention.

DETAILED DESCRIPTION OF THE PREFERRED EMBODIMENTS

Figure 1:
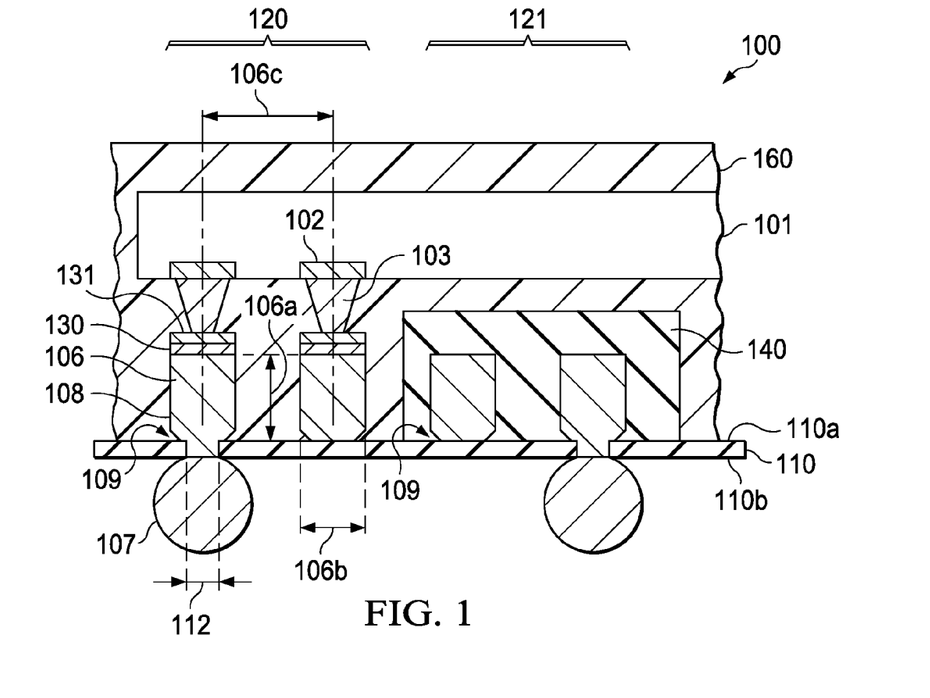
FIG. 1 shows a schematic cross section of a portion of an encapsulated ball grid array (BGA) package with a substrate tape and metallic traces of rectangular cross section, thin bondable layers covering the top of some traces according to the invention, while the trace sidewalls are un-covered by the metallic layers, and a semiconductor chip with contact studs attached to the bondable traces.
Figure 2:
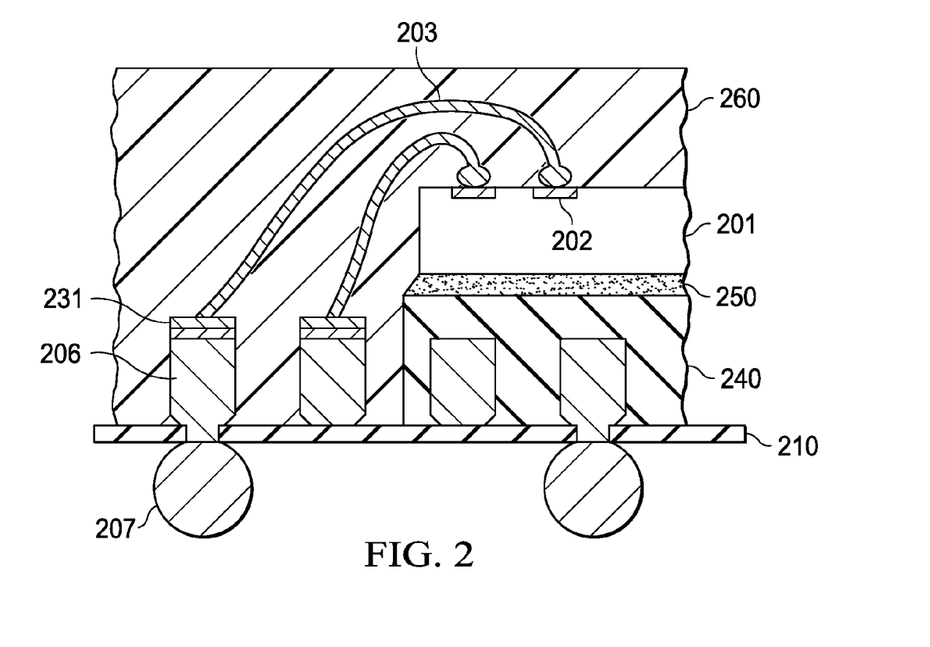
FIG. 2 shows a schematic cross section of a portion of an encapsulated ball grid array (BGA) package with a substrate tape and metallic traces of rectangular cross section, thin bondable layers covering the top of some traces according to the invention, while the trace sidewalls are un-covered by the metallic layers, and a semiconductor chip with bonding wires attached to the bondable traces.

FIGS. 1 and 2 illustrate cross sections of portions of exemplary BGA devices, which include embodiments of the invention. In FIG. 1, the device, generally designated 100, has chip 101 with terminals 102, onto which metallic studs 103 are affixed as chip contacts. Studs 103 are preferably made of gold; alternatively, studs 103 may be made of copper or a copper alloy. While studs 103 are schematically depicted as a truncated cones, their actual shapes may be more complex.

FIG. 1 depicts a portion of the substrate, onto which chip 101 is assembled. The substrate includes the insulating tape 110 with first surface 110a and second surface 110b. Insulating tape 110 is preferably a sheet of a polyimide compound with a thickness ranging from about 40 to 80 μm. The through-holes with diameter 112 extend through the substrate base from the first surface 110a to the second surface 110b. Through-hole diameter 112 is preferably in the range from 50 to 120 μm. As FIG. 1 shows, the through-holes are filled with metal; the filler includes the metal of the traces 106, which partially fills the through-hole and is preferably made of copper, and the solder alloy of solder bodies 107, which fills the remainder of the through-hole. Solder bodies 107 serve the contact of the BGA device to external parts.

On the first surface 110a of the substrate tape is a plurality of metallic traces 106, which are made of a first metal. The first metal is preferably copper or a copper alloy. Traces 106 have a first thickness (height) 106a, a width 106b, and a pitch center-to-center 106c. The ratio height 106a versus width 106b determines the aspect ratio of the traces. In addition, traces 106 have a substantially rectangular cross section (the undercut at the interface with tape 110 is described below), wherein the trace sidewalls are normal to the trace top surface. Preferably, first thickness (height) 106a is between about 12 and 15 μm; it may be thinner in devices, where trace resistance and trace fatigue requirements permit. Preferably, width 106b is between about 12 and 50 μm, but may I principle be considerably greater than 50 μm. The spacing between traces has the same magnitude as the traces; consequently, the pitch 106c center-to-center is in exemplary embodiments between about 25 and 100 μm.

As FIG. 1 shows, the traces can be grouped in a first set 120 and a second set 121. The traces of the first set 120 have their top surface covered by a second metal, which has a second thickness smaller than the first thickness 106a. In the preferred embodiment, the second metal is a stack of metal layers, which includes a thin nickel layer 130 with a thickness of 0.08±0.04 μm in contact with the first metal 106 (preferably copper) and an outermost layer 131 of a noble metal in contact with the nickel layer 130. The noble metal is bondable. The noble metal 131 is preferably gold; alternatively, it may be palladium, the thickness range is preferably between about 0.3 and 0.6 μm.

FIG. 1 illustrates that the sidewalls 108 of the first set traces 120 are un-covered by the second metal and rather exhibit the metal of the traces. Consequently, the pitch 106c of the traces can be minimized; compared to the conventional situation, where the second metal covers all trace surfaces, pitch 106c can shrink by about 1.5 μm.

The second set traces 121 have the top surface un-covered by the second metal. Rather, the top surface and the sidewalls of the traces are covered by an insulating soldermask 140.

In FIG. 1, the terminals 102 of chip 101 are attached to the second, bondable metal 131 of the first set traces 120 by metal studs 103 (flip-chip assembly methodology). In contrast, another embodiment using the wire bonding assembly methodology is illustrated in FIG. 2. Chip 201 is adhesively attached to soldermask 240 by attach polymer 250. The chip terminals 202 are connected by bonding wires 203 the second metal 231 of the first set traces 206.

FIGS. 1 and 2 indicate that it is advantageous to encapsulate the device in a polymer compound 160 and 260, respectively, preferably an epoxy-based molding compound. After polymerization, the encapsulation not only protects the assembled chip and portions of the substrate with the traces, but also offers mechanical robustness to the device, especially when substrate 110 and 210, respectively, is a tape of only about 50 μm thickness.

Solder bodies 107 and 207, respectively, complete the BGA device and serve the attachment of the device to external parts.

Referring now to FIG. 1, as a consequence of the fabrication process flow (see below), the sidewalls 108 of the first set traces 120 were protected by photoresist throughout the plating steps of the first and second metal. Consequently, sidewalls 108 are uncovered by the second metal. However, after removal of the photoresist, ambient influences, especially oxygen, transforms the freshly-exposed surface-near sidewall metal into metal oxides such as copper oxides. The metal oxides, in turn, enhance the adhesion of the molding compound 160 to the first set traces 106.

Furthermore, as another consequence of the fabrication process flow (see below), the traces of the first set 120 and the second set 121 exhibit metal undercuts at the interface of the traces 106 and tape 110. In FIG. 1, the undercuts are designated 109. These undercuts represent mechanical locks for encapsulation compound 160, and thus represent a warranty against device delamination due to thermo-mechanical stress.

Another embodiment of the invention is a method for fabricating a semiconductor device based of the ball grid array (BGA) family. The method uses additive processes such as electroplating to create substrate traces with rectangular cross sections and controlled aspect ratios of height versus width, thus maximizing the area available for attaching the chip bumps, while simultaneously minimizing the trace pitch center-to-center. The method further avoids the need for plating buss bars, permits the plating of very thin nickel layers, and minimizes the use of precious metals.

Figure 3:
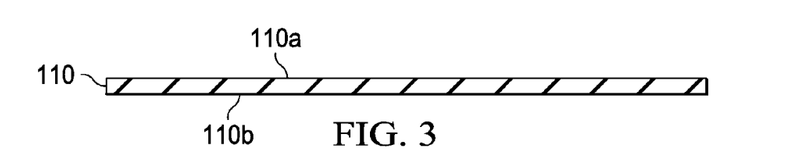
FIG. 3 shows the starting substrate tape.
Figure 4:
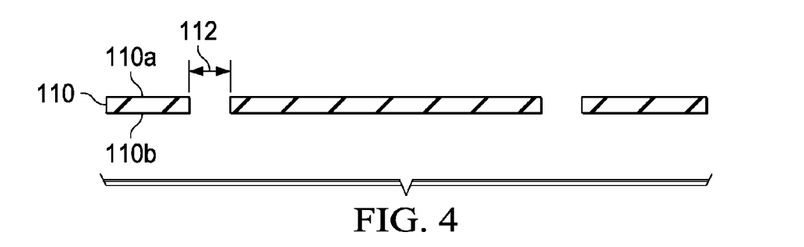
FIG. 4 illustrates the opening of through-holes.
Figure 5:
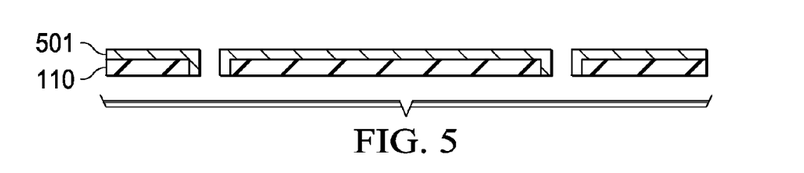
FIG. 5 shows the electroless plating of the first metal seed layer.

The method starts in FIG. 3 by providing an insulating substrate 110 in the thickness range from about 40 to 60 μm. The substrate may either be a flat, flexible tape, made for instance of a polyimide compound and processed in a reel-to-reel equipment, or a rigid flat sheet. The substrate has a first surface 110a and a second surface 110b. Next, as illustrated in FIG. 4, holes of diameter 112 are formed through the thickness of the substrate 110 from the first to the second surface. The forming process may be laser drilling or mechanical punching. For many devices, the preferred through-hole diameter is between about 250 and 300 μm In the next process step (FIG. 5), a seed layer 501 of a first metal is plated by electroless process on the first tape surface 110a and on the through-hole walls. The preferred thickness range of the seed layer is between about 0.2 and 0.5 μm, and the first metal is selected from a group including copper and copper alloy. The seed layer operates to distribute a uniform electrical potential across the tape in the subsequent electroplating process. In an alternative process step, the insulating substrate has the seed layer bonded to it, for instance by vapor deposition or by an adhesive.

Figure 6:
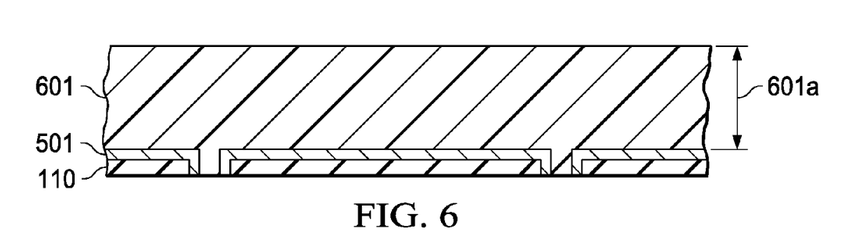
FIG. 6 illustrates the application of the first photoresist layer on the seed layer.

FIG. 6 depicts the step of depositing a first layer 601 of photoresist on the seed layer 501. A preferred deposition process is laminating a dry film on the first metal seed layer; alternatively the photoresist layer may be printed. The thickness 601a of layer 601 is selected so that it will be slightly larger than the height of the substrate traces-to-be-plated; consequently the thickness of layer 601 is preferably in the range from 15 to 20 μm.

Figure 7:
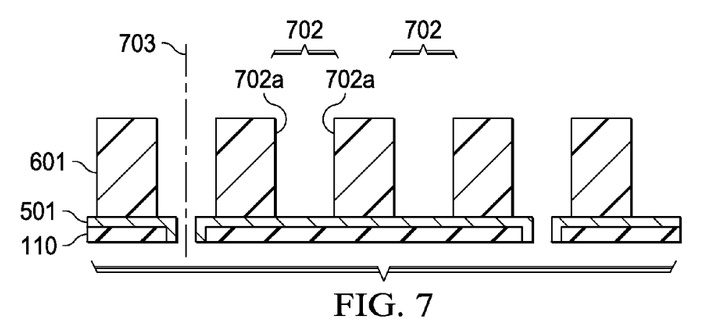
FIG. 7 depicts the development of the first photoresist layer to expose portions of the seed layer.

FIG. 7 indicates the photolithographic process step. A photomask is positioned on first photoresist layer 601 to define traces for interconnections; in this example, a negative image exposure and resist development is assumed in order to create openings 702 in the photoresist 601 and expose portions of the seed layer 501. As centerline 703 in FIG. 7 shows, a plurality of openings (future traces) is aligned center-to-center with the through-holes. In the process, photoresist 601 is exposed and developed to create the openings and expose portions of the seed layer 501. The photoresist process ensures that the openings 702 have sidewalls 702a normal to the flat tape.

It is a technical advantage that the method of the invention allows a high degree of freedom for selecting the aspect ratio of the traces-to-be-plated. This freedom of choice begins with the selection of the width 702 of the photoresist openings relative to the thickness 601a of the photoresist.

Figure 8:
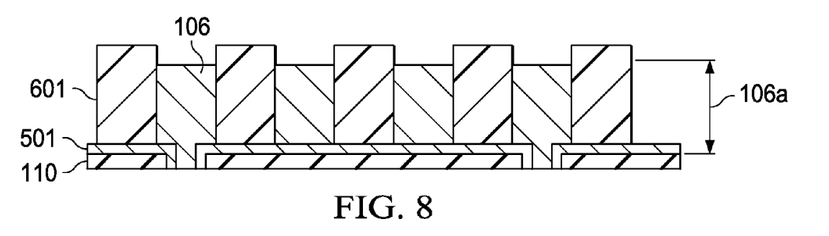
FIG. 8 shows the electrolytic plating of the first metal for the future traces and the through-hole filling.

The next process step, illustrated in FIG. 8, produces the electrolytical plating of the exposed portions of seed layer 501. The preferred method for the plating step is a reel-to-reel plating line, wherein the plastic tape with the seed layer 501 of the first metal, runs from the starting reel through a cleaning tank, an activation tank, the electrolytic plating tank for the first metal, and a drying tank to the collecting reel. Preferably, the first metal is copper. The plating process deposits first metal in the openings and in the through-holes, until the plated first metal reaches a first height 106a (includes the seed layer thickness). The metal-filled openings are the future traces 106; the traces have a rectangular cross section.

Figure 9:
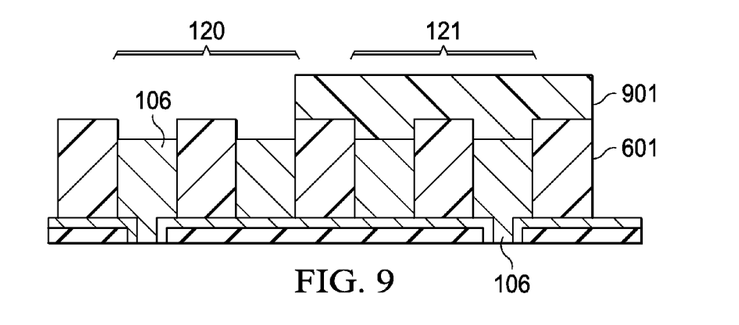
FIG. 9 illustrates the application of the second photoresist layer over the second set traces.

As FIG. 9 indicates, the next process step groups the plated traces into a first set 120 and a second set 121. A second layer 901 of photoresist is deposited across the traces 106 of the second set 121 and the first photoresist regions 601 between the traces 106 in order to mask the second set traces 121.

Figure 10:
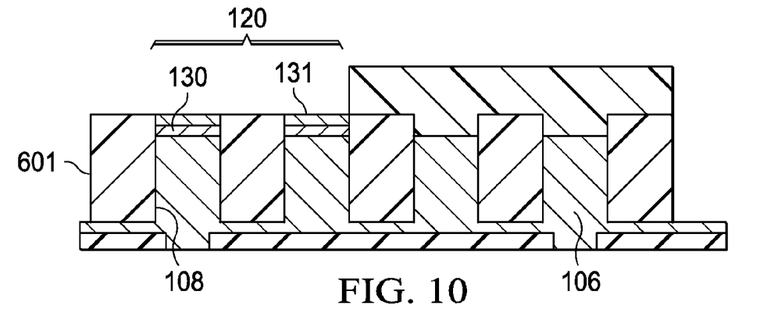
FIG. 10 depicts the electrolytic plating of the second metal on the first set traces (the second metal may be a stack of two metals).

Next, a layer of a second metal is electrolytically plated on top of the un-masked traces 106 of the first set 120. FIG. 10 shows the results of the next process step. Since the second metal is preferably a stack of metal layers, the substrate tape is running through a nickel plating tank and then a noble metal plating tank. In the nickel plating tank, a thin nickel layer 130 (preferably 0.08±0.04 μm) is deposited on the top of the first metal of trace 106. In the preferred embodiment, the thin nickel is thus in contact with the copper of the trace. In the noble metal plating tank, a layer 131 of noble metal (preferably gold; alternatively palladium) in the thickness range from about 0.3 to 0.6 µm is deposited on the nickel layer. Since the first photoresist regions 601 are contiguous with the sidewalls 108 of the traces 106, the nickel and noble metal layers cannot be deposited on the sidewalls 108 of the traces, not only saving some cost of the noble metal, but also retaining the space between traces to minimize the pitch between traces.

Figure 11:
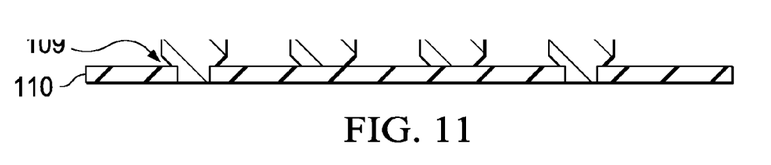
FIG. 11 shows the removal of both photoresist layers and etching of the seed layer.

FIG. 11 indicates the next process step of removing both the first and the second photoresist layers. The sidewalls 108 of the traces 106 are now exposed to ambient; this fact together with the process of removing the photoresist cause a superficial oxidation of the first metal at the sidewalls 108. As an example, when the first metal of the traces is copper, a skin of copper oxide is formed on the sidewalls 108. These metal oxides are beneficial for the adhesion to polymer encapsulation compounds used later for packaging the assembled chips.

FIG. 11 further indicates the removal of the portions of the first metal seed layer not covered by the plated first metal (of the traces 106). Since the preferred method of removal is chemical etching and since metal (for instance copper) etching is anisotropic, metal undercuts 109 are formed at the interface of traces 106 with the insulating tape 110. These trace undercuts are beneficial for offering locks for the polymer encapsulation compounds used later in packaging the assembled chips.

Figure 12:
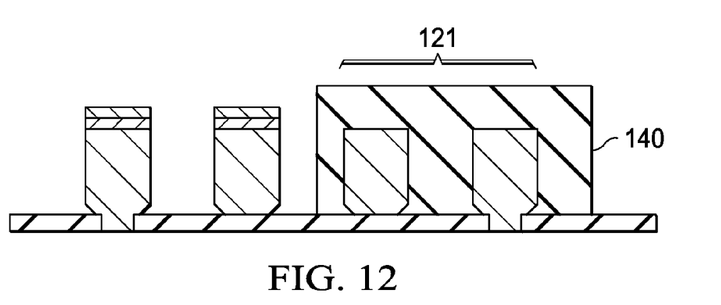
FIG. 12 illustrates the application of a soldermask over the second set traces.

FIG. 12 summarizes the next process steps of depositing, exposing and developing a layer 140 of insulating soldermask on the traces of the second set 121. Soldermask 140 surrounds and thus protects the exposed surfaces of the second set traces. In addition, solder mask 140 provides rigidity to the substrate. After the application of soldermask 140, the substrate fabrication is competed and the substrate is ready to accept the assembly of a semiconductor chip with electrical connection to the chip terminals.

Figure 13A:
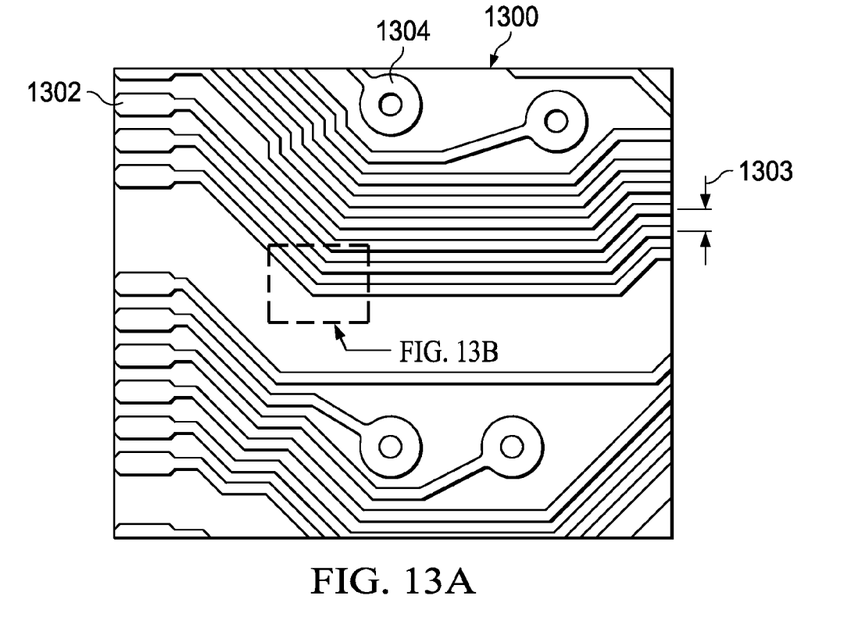
FIG. 13A is a top view of the substrate used for a ball grid array (BGA) device and intended for flip-chip or for wire bond chip assembly. Metallic traces and through-holes are indicated.
Figure 13B:
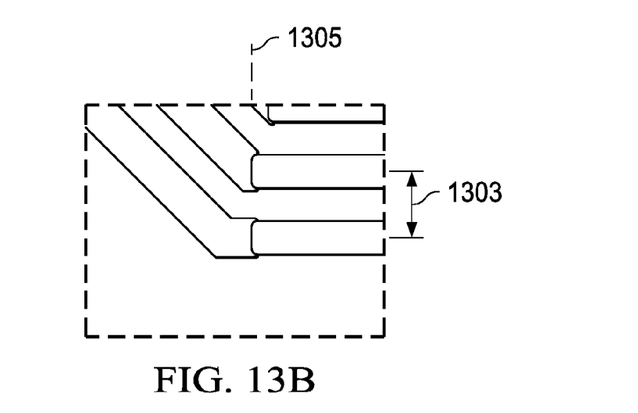
FIG. 13B is a magnified view of a portion of FIG. 13A.

FIG. 13A, with more detail in FIG. 13B, offers top views of a portion of a substrate prepared by the process steps described above. In FIG. 13A, the metal traces for interconnection are designated 1301; some sections of the traces may have widened segments 1302 for attaching the metal studs or wire bonds of the chips. The pitch 1303 of the traces may be between 25 and 100 µm. The through-holes through tape 1300 are designated 1304. In the enlargement of FIG. 13B, the border contour 1305 of the protective soldermask can be identified. In the example of FIG. 13A, the metallized through-holes are located in the area covered by the soldermask.

Figure 14:
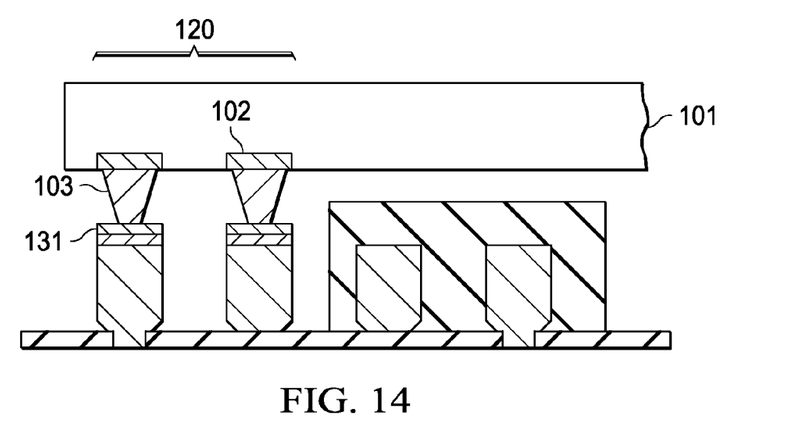
FIG. 14 illustrates the assembly of a semiconductor chip on the substrate using metal studs.
Figure 15:
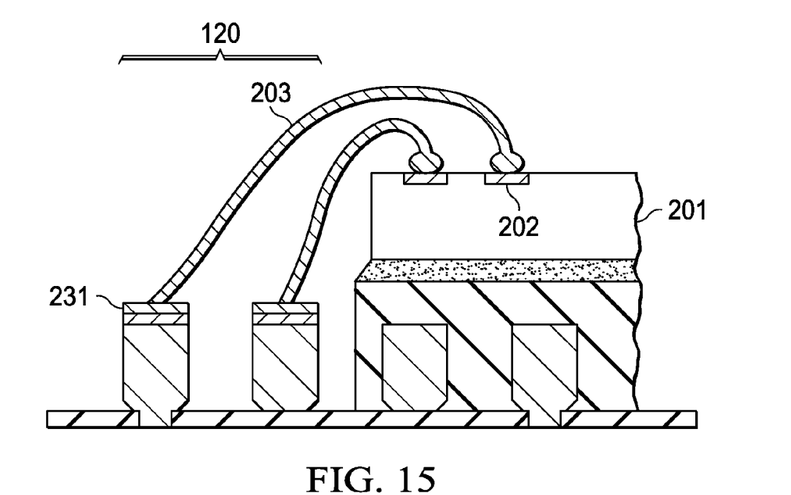
FIG. 15 shows the assembly of a semiconductor chip on the substrate using bonding wires.

FIGS. 14 and 15 illustrate the step of attaching a semiconductor chip 101 with terminals 102 to the substrate by connecting the terminals to the second metal, specifically to the noble metal layer 131, on the first set traces 120. In FIG. 14, the connection is effectuated by metal studs 103, in FIG. 15 by bonding wires 203.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any type of semiconductor chip, discrete or integrated circuit, in a BGA-type package, for flip-chip assembly of for wire-bonded assembly. The material of the semiconductor chip may comprise silicon, silicon germanium, gallium arsenide, or any other semiconductor or compound material used in integrated circuit manufacturing.

As another example, the invention applies to rigid, discrete BGA substrates and also to flexible substrates, which are fabricated on a reel-to-reel basis.

As another example, the invention applies to BGA devices with substrates having more than one metal layer and thus more than one level of traces.

As another example, the invention applies to substrates 110 with traces on the first substrate surface 110a as well as on the second substrate surface 110b (double sided substrate). Further, the solder bodies can be can be on either the first surface 110a or on the second surface 110b.

It is therefore intended that the appended claims encompass any such modifications or embodiments.

I claim:

1. A method for fabricating a semiconductor device comprising the steps of:
   forming through-holes in a flat tape having a first and a second surface;
   forming a seed layer of a first metal on the first tape surface;
   depositing a first layer of photoresist on the seed layer;
   exposing and developing the photoresist to create a pattern of openings exposing portions of the seed layer, wherein the openings have sidewalls normal to the flat tape;
   electrolytically plating additional first metal on the exposed seed layer portions, until the plated first metal reaches a first height, thereby creating the traces of a rectangular cross section;
   depositing a second layer of photoresist to mask a portion of the traces and to expose a portion of the traces;
   electrolytically plating a layer of a second metal on top of the exposed portion of the traces;
   removing both the first and the second photoresist layers, thereby exposing and oxidizing the first metal of the trace sidewalls;
   etching the portions of the first metal seed layer not covered by the plated first metal, thereby undercutting the first metal at the tape interface; and
   attaching a semiconductor chip with terminals to the substrate by connecting the terminals to the layer of the second metal.

2. The method of claim 1 wherein the tape is made of a polyimide-based compound in the thickness range from about 40 to 80 µm.

3. The method of claim 1 wherein the seed layer has a thickness range from about 0.2 to 0.5 µm.

4. The method of claim 1 wherein the first metal is selected from a group including copper and aluminum.

5. The method of claim 1 wherein the step of depositing a first layer of photoresist is a step of laminating a dry film on the first metal seed layer.

6. The method of claim 1 wherein the second photoresist layer is a photoimagible plating mask.

7. The method of claim 1 wherein the second metal is a stack of metal layers including a nickel layer 0.08±0.04 µm thick in contact with the first metal, and an outermost layer of noble metal in contact with the nickel layer, the noble metal selected from a group including gold, palladium, and platinum in the thickness range from about 0.3 to 0.6 µm.

8. The method of claim 1 wherein the step of attaching includes studs of gold or copper for connecting the chip terminals to the second metal on the traces.

9. The method of claim 1 wherein the step of attaching includes bonding wires of gold or copper for connecting the chip terminals to the second metal on the traces.

10. The method of claim 1 further including the step of encapsulating the assembled chip and the traces in a protective polymerized compound.

11. The method of claim 9 wherein the encapsulating compound is locking into the first metal undercuts.

12. The method of claim 1 further including the step of attaching solder bodies to the second tape surface at the through-holes filled with first metal.

13. A method for fabricating a semiconductor device comprising:
   forming a metallic seed layer over a substrate strip;
   forming a first photoresist pattern of openings on the seed layer exposing portions of the seed layer;
   electrolytically plating a first metal on the exposed seed layer portions to a first height, thereby creating traces of first metal;
   forming a second photoresist pattern over the first photoresist pattern, covering a portion of the metal traces and exposing a portion of the metal traces; and
   electrolytically plating a second metal layer on the exposed portion of the metal traces.

14. The method of claim 13, further comprising attaching a semiconductor chip on the substrate.

15. The method of claim 14, further comprising encapsulating an assembly including the semiconductor chip and the metallic traces and a first surface of the substrate with a molding compound, exposing a second surface of the substrate opposite the first surface.

16. The method of claim 15, further comprising cutting the molded assembly without exposing the metallic traces.

* * * * *